(12) United States Patent
Tang et al.

(10) Patent No.: US 7,598,600 B2
(45) Date of Patent: Oct. 6, 2009

(54) STACKABLE POWER SEMICONDUCTOR PACKAGE SYSTEM

(75) Inventors: Wai Kwong Tang, Singapore (SG); You Yang Ong, Kuantan (MY); Kuan Ming Kan, Seremban (MY); Larry Lewellen, San Jose, CA (US)

(73) Assignee: Stats Chippac Ltd., Singapore (SG)

( * ) Notice: Subject to any disclaimer, the term of this patent is extended or adjusted under 35 U.S.C. 154(b) by 327 days.

(21) Appl. No.: 11/307,247

(22) Filed: Jan. 27, 2006

(65) Prior Publication Data

US 2007/0108560 A1    May 17, 2007

Related U.S. Application Data

(60) Provisional application No. 60/671,554, filed on Apr. 15, 2005, provisional application No. 60/666,977, filed on Mar. 30, 2005.

(51) Int. Cl.
*H01L 23/495* (2006.01)

(52) U.S. Cl. .................. 257/666; 257/669; 257/676; 257/779; 257/E23.031; 257/E23.04; 257/E23.047; 257/E23.048

(58) Field of Classification Search .................. 257/666, 257/669, 676, 779, 780, E23.031, E23.04, 257/E23.047, E23.048
See application file for complete search history.

(56) References Cited

U.S. PATENT DOCUMENTS

| | | | |
|---|---|---|---|
| 4,907,067 A | 3/1990 | Derryberry | 357/74 |
| 4,935,803 A | 6/1990 | Kalfus et al. | |
| 5,103,290 A | 4/1992 | Temple et al. | |
| 5,294,826 A | 3/1994 | Marcantonio et al. | |
| 5,821,611 A | 10/1998 | Kubota et al. | |
| 6,204,554 B1 | 3/2001 | Ewer et al. | 257/705 |
| 6,261,404 B1 | 7/2001 | Baska et al. | |
| 6,307,755 B1 | 10/2001 | Williams et al. | |
| 6,424,031 B1* | 7/2002 | Glenn | 257/686 |
| 6,492,725 B1 | 12/2002 | Loh et al. | 257/723 |
| 6,528,880 B1 | 3/2003 | Planey | 257/735 |
| 6,765,292 B2 | 7/2004 | Cheah et al. | 257/734 |
| 7,332,806 B2* | 2/2008 | Joshi et al. | 257/706 |
| 2003/0052408 A1* | 3/2003 | Quinones et al. | 257/737 |
| 2006/0201709 A1* | 9/2006 | McIver | 174/521 |

\* cited by examiner

*Primary Examiner*—Monica Lewis
(74) *Attorney, Agent, or Firm*—Mikio Ishimaru

(57) ABSTRACT

The present invention provides a method of making a stackable power semiconductor package system comprising forming a lower lead frame, having an upward bent source lead and an upward bent gate lead, mounting a power semiconductor device on the lower lead frame utilizing interconnect structures and forming an upper lead frame wherein the upper lead frame is on the power semiconductor device.

4 Claims, 6 Drawing Sheets

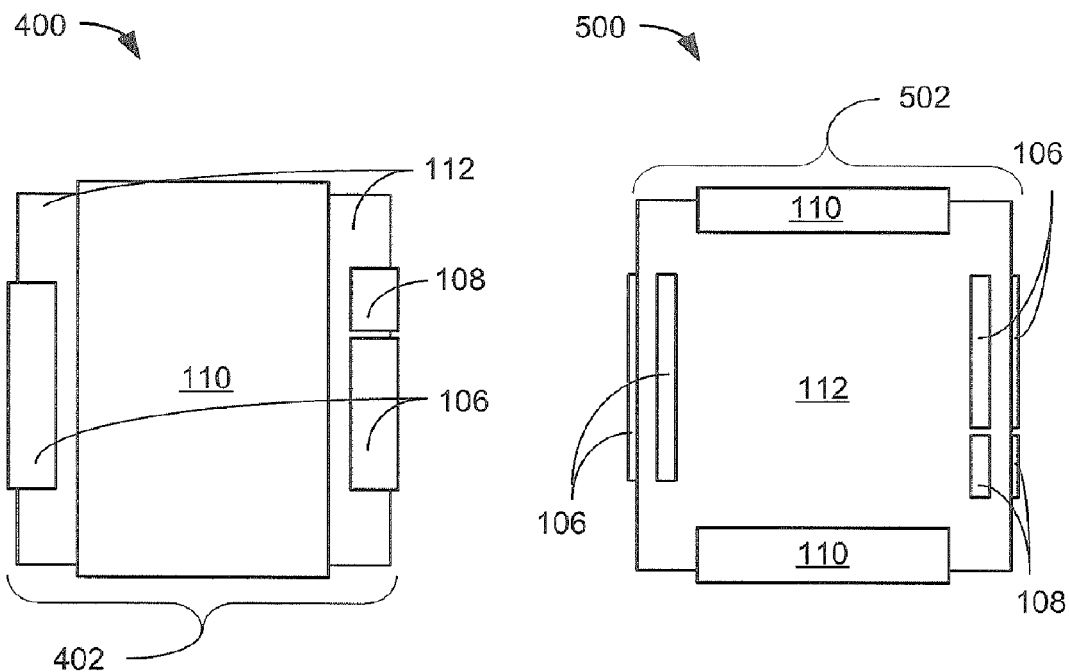
FIG. 4
FIG. 5
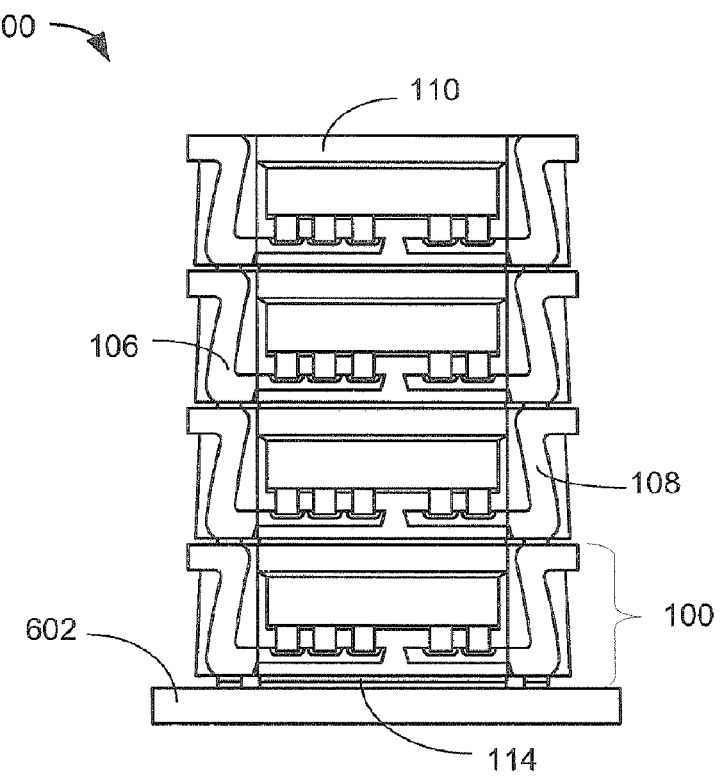
FIG. 6

STACKABLE POWER SEMICONDUCTOR PACKAGE SYSTEM

CROSS-REFERENCE TO RELATED APPLICATIONS

This application claims the benefit of U.S. Provisional Patent Application Ser. No. 60/671,554 filed Apr. 15, 2005 and the subject matter thereof is hereby incorporated herein by reference thereto.

This application also claims the benefit of U.S. Provisional Patent Application Ser. No. 60/666,977 filed Mar. 30, 2005 and the subject matter thereof is hereby incorporated herein by reference thereto.

TECHNICAL FIELD

The present invention relates generally to integrated circuit package systems, and more particularly to a system of stackable power semiconductor package.

BACKGROUND ART

The design of personal electronic devices, such as cell phones and hand held computers, require significant power conditioning and regulation. These processes are facilitated through the application of power semiconductor devices which can handle relatively high current. Historically these power semiconductor devices have been restricted to the amount of current that they can conduct, because the heat associated with the current transfer can damage the device causing reliability issues. The industry standard package for power semiconductor devices is the "SO-8", an eight pin, surface mounted, plastic enclosed device. The demand for higher frequencies and stronger wireless connections has stressed this technology to the breaking point.

Heat management improvements in power discrete semiconductor packages, in particular for DC-DC or DC-AC converters, have seen slow progress. These converters often employ multiple parallel SO-8 devices, such as synchronous rectifiers, due to printed circuit board (PCB) real estate constraints. The layout of the PCB becomes congested due to the parallel arrangement of the original legacy power packages. Traditionally in SOIC leaded form, an SO-8 package is thermally inferior in handling high current and high power devices. Typically, the junction-to-solder point thermal resistance of an SO-8 device is in the range of 20 k/W to 30 k/W, depending on the chip size and current rating. The junction-to-mounting base thermal resistance of a TO 251/252 or PowerPAK device is usually in the range of 2 k/W to 3 k/W. This means the inferior thermal capability of the SO-8 package has necessitated the need to arrange multiple devices in parallel to spread the power dissipation and prevent any one device from running too hot. Unfortunately, the parallel arrangement of many devices on the PCB, may also lead to excessive source-to-drain current discharges in the connecting MOSFET drivers, as well as having negative impact on the converter's overall efficiency.

Vertically stacking SO-8 packages together does not improve heat dissipation capability. The current design of SO-8 packages in the market place, either leaded or leadless version, has no electrical connecting terminals on top of the package surface that links the device common Source (S), Gate (G) or Drain (D) when being stacked package-on-package (PoP). Having mold compound abraded together for PoP purpose leads to higher heat storage capacity, opposing the trend for integrating more heat dissipation features to achieve faster device cooling effect. The technology trends are clearly adding stress to the power semiconductor market. Packaging redesign in terms of form factor change and thermal management is needed to deliver the latest power devices needed by today's market.

Thus, a need still remains for a system of stackable power semiconductor package. In view of the demand to shrink device form factors on PCB's and increase the power dissipation capabilities, it is increasingly critical that answers be found to these problems. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of making a stackable power semiconductor package system comprising forming a lower lead frame, having an upward bent source lead and an upward bent gate lead, mounting a power semiconductor device on the lower lead frame utilizing interconnect structures and forming an upper lead frame wherein the upper lead frame is on the power semiconductor device.

Certain embodiments of the invention have other advantages in addition to or in place of those mentioned or obvious from the above. The advantages will become apparent to those skilled in the art from a reading of the following detailed description when taken with reference to the accompanying drawings.

BRIEF DESCRIPTION OF THE DRAWINGS

FIG. 4 is a top view of a stackable power semiconductor package system;

FIG. 5 is a bottom view of a stackable power semiconductor package system;

FIG. 6 is a cross-sectional view of a four device stack of the stackable power semiconductor package system, in an embodiment of the present invention;

BEST MODE FOR CARRYING OUT THE INVENTION

Figure 1:
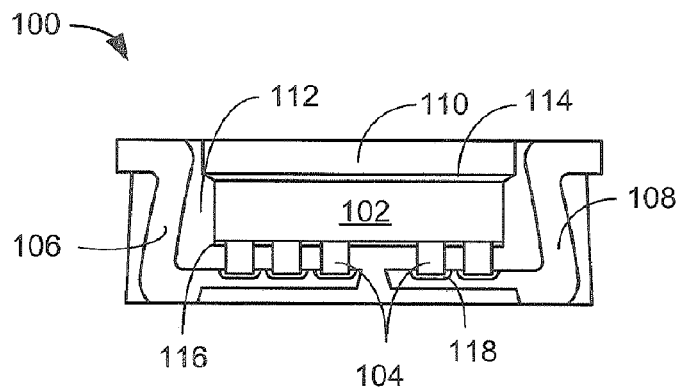
FIG. 1 is a cross-sectional view of a stackable power semiconductor package system along line 1-1 of FIG. 2 in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

The term "horizontal" as used herein is defined as a plane parallel to the conventional plane or surface of the package top, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material, patterning, exposure, development, etching, cleaning, and/or removal of the material as required in forming a described structure.

Figure 2:
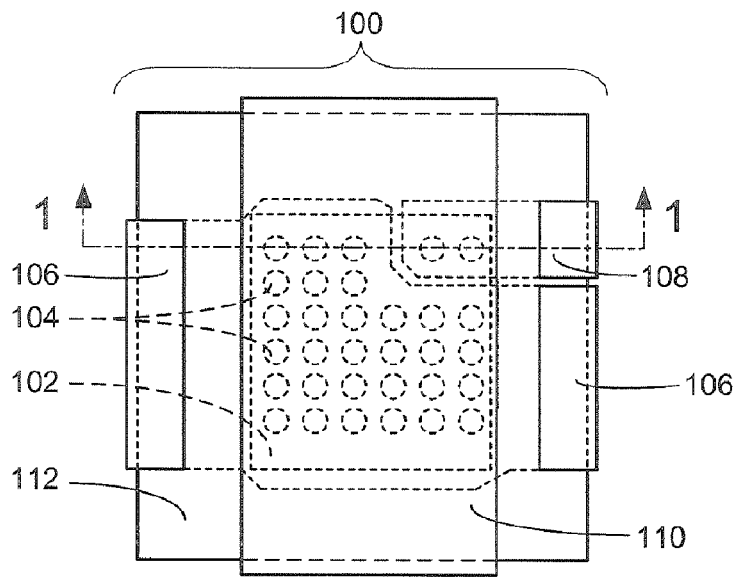
FIG. 2 is a plan view of the stackable power semiconductor package system.

Referring now to FIG. 1, therein is shown a cross-sectional view of a stackable power semiconductor package system 100 along line 1-1 of FIG. 2 in an embodiment of the present invention. The cross-sectional view of the stackable power semiconductor package system 100 depicts a power semiconductor device 102, interconnect structures 104, a first upward bent source lead 106, a first upward bent gate lead 108, an upper lead frame 110, a molding compound 112, a soft solder 114, such as solder paste, a die metallization layer 116, such as phosphosilicate glass (PSG) over silicon nitride (SiN), and a stress relief layer 118, such as molybdenum or other equivalent material.

The first upward bent source lead 106 and the first upward bent gate lead 108 are partially etched on the bottom to allow a clearance for the molding compound 112. The stackable power semiconductor package system 100 has the molding compound 112 across its bottom that acts as an insulator during package stacking. The soft solder 114 electrically and thermally connects the power semiconductor device 102 to the upper lead frame 110. The interconnect structures 104 are sandwiched between the die metallization layer 116 and the stress relief layer 118. The stress relief layer 118 expands or contracts to absorb stresses caused by thermal expansion.

Referring now to FIG. 2, therein is shown a plan view of the stackable power semiconductor package system 100. The superimposed view of the stackable power semiconductor package system 100 depicts the power semiconductor device 102, the interconnect structures 104, such as solder balls, solder bumps, solder columns or stud bumps, the first upward bent source lead 106, the first upward bent gate lead 108, the upper lead frame 110 and the molding compound 112, such as Thermoset or other comparable molding material.

The power semiconductor device 102 has electrical contacts representing the source, electrically connected to the first upward bent source lead 106, the gate, electrically connected to the first upward bent gate lead 108 and the drain, electrically connected to the upper lead frame 110. The upper lead frame 110 also acts as a heat spreader, which helps maintain a lower junction temperature under heavy current load.

Figure 3:
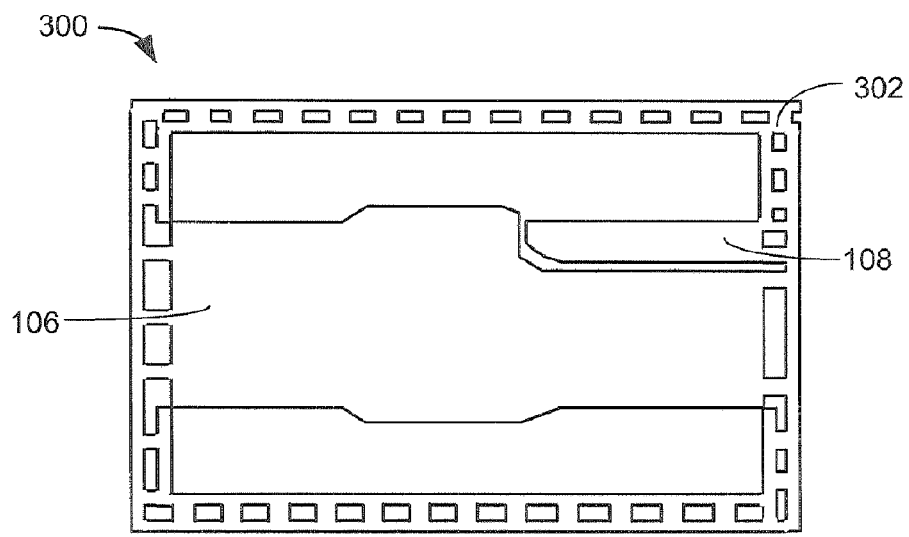
FIG. 3 is a top view of a lower lead frame for the stackable power semiconductor package system of FIG. 1.

Referring now to FIG. 3, therein is shown a top view of a lower lead frame 300 for the stackable power semiconductor package system 100 of FIG. 1. The lower lead frame 300 includes a lead frame border 302, the first upward bent source lead 106, without the bending and trim, and the first upward bent gate lead 108, without the bending and trim. The lower lead frame 300 is die cut from a large sheet of copper or tin. A single instance of the lower lead frame 300 is shown for example only. Although, many of the lower lead frame 300 are in an array and cut. The flat sheet of the lower lead frame 300 is pressed into a die to establish the desired bends for the components. The lead frame border 302 is trimmed off with the power semiconductor device 102 attached.

Referring now to FIG. 4, therein is shown a top view of a stackable power semiconductor package system 400. The top view shows a top 402 of the stackable power semiconductor package system 400, the first upward bent source lead 106, the first upward bent gate lead 108, the upper lead frame 110, and the molding compound 112. The top view of the stackable power semiconductor package system 100 indicates the relative position of top electrical contact elements for the first upward bent source lead 106, the first upward bent gate lead 108, and the upper lead frame 110 all of the top electrical contact elements are coplanar with the molding compound 112.

Referring now to FIG. 5, therein is shown a bottom view of a stackable power semiconductor package system 500. The bottom view shows a bottom 502 of the stackable power semiconductor package system 500, the electrical contact locations for the first upward bent source lead 106, the first upward bent gate lead 108 as well as the upper lead frame 110. Both the first upward bent source lead 106 and the first upward bent gate lead 108 have a top surface protrusion that is visible from the bottom view. The area covered by the molding compound 112 is coplanar with the bottom electrical contacts of the first upward bent source lead 106, the first upward bent gate lead 108, and the upper lead frame 110 while providing an electrical insulator and solder resist region around them. The spacing between the electrical contacts of the first upward bent source lead 106, the first upward bent gate lead 108 and the upper lead frame 110 allows mechanical clearance during the soldering process.

Referring now to FIG. 6, therein is shown a cross-sectional view of a four device stack 600 of the stackable power semiconductor package system 100, in an embodiment of the present invention. The four device stack 600 of the stackable power semiconductor package system 100 shows the configuration of complementary interfaces of four of the stackable power semiconductor package system 100 stacked the bottom 502, of FIG. 5, to the top 402, of FIG. 4, on a PCB 602. The bottom 502, having the bottom electrical contacts, coupled to the top 402 by the top electrical contact elements electrically and thermally connected to the bottom electrical contacts by the soft solder 114. Stacking complementary units of the stackable power semiconductor package system 100, having individual contacts, provides electrical and thermal connection to the PCB 602 for all stacked packages. The stackable power semiconductor package system 100 includes the molding compound 112, of FIG. 1, that may act as the solder resist region between the individual contacts of the bottom 502 and the top 402. The configuration is for example and is not limited to four stacked devices. There could be fewer or more devices in the stack as required.

The package stacking option enabled by the stackable power semiconductor package system 100 conserves space on the PCB 602. The stackable power semiconductor package system 100 is attached to the PCB 602 with the soft solder 114. The soft solder 114 also electrically and thermally connects the individual contacts, such as the first upward bent source lead 106, the first upward bent gate lead 108 and the upper lead frame 110, in the stack to the PCB 602. In this way, all of the contacts of the first upward bent source lead 106 are connected to each other and the PCB 602. This is also true for the contacts of the first upward bent gate lead 108 and the contacts of the upper lead frame 110.

Figure 7:
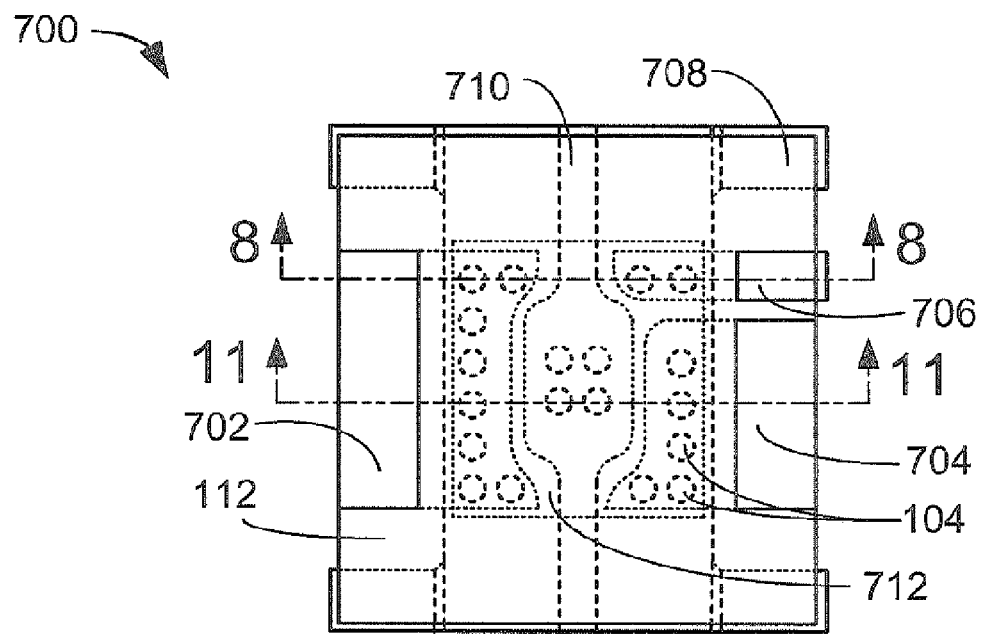
FIG. 7 is a plan view of a stackable power semiconductor package system, in an alternative embodiment of the present invention.

Referring now to FIG. 7, therein is shown a plan view of a stackable power semiconductor package system 700, in an alternative embodiment of the present invention. The stackable power semiconductor package system 700 includes a second upward bent source lead 702, a third upward bent source lead 704, a second upward bent gate lead 706, a second upper lead frame 708, a center heat sink 710, having partially etched tie bars, a dual source semiconductor device 712, the interconnect structures 104, the molding compound 112 and the soft solder 114. The dual source semiconductor device 712 is used in circuits that have two similar but distinct power sources, such as an I/O bus between two different chips. This configuration can also be used for high current applications that would overstress the power semiconductor device 102, shown in FIG. 1, having a single source.

Figure 8:
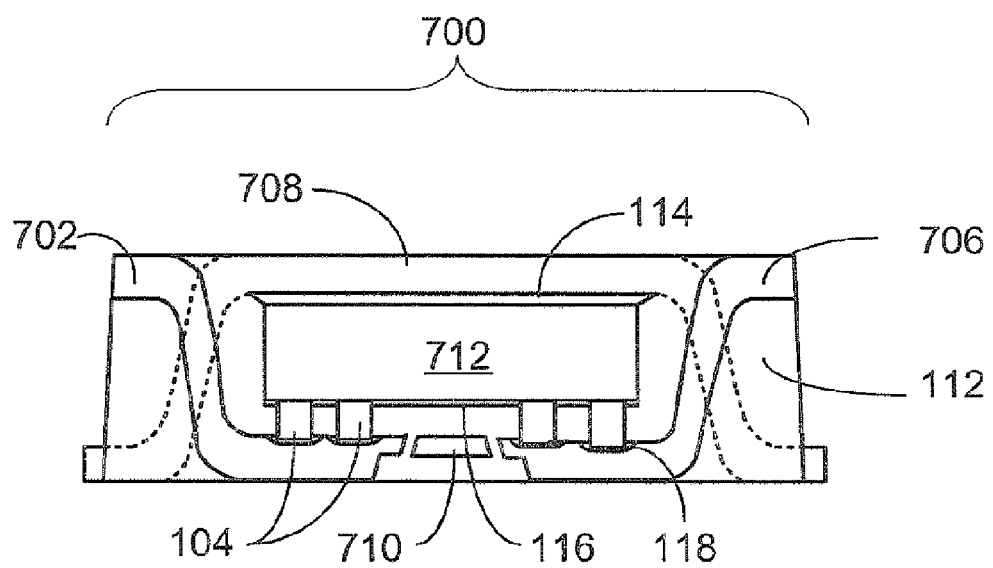
FIG. 8 is a cross-sectional view of the stackable power semiconductor package system, as shown in FIG. 7.

Referring now to FIG. 8, therein is shown a cross-sectional view of the stackable power semiconductor package system 700, as shown in FIG. 7. The cross-sectional view, of the stackable power semiconductor package system 700, shows the relative positions of the lead frame components within the assembly. The dual source semiconductor device 712 attaches to the second upper lead frame 708 by the soft solder 114. The interconnect structures 104 provide a current path from the die metallization layer 116, such as PSG over SiN, to the stress relief layer 118, such as Molybdenum or other equivalent material. The stress relief layer 118 is present on the areas of leads contacting the interconnect structures 104, the second upward bent source lead 702, the third upward bent source lead 704 and the second upward bent gate lead 706. In this view, the partially etched tie bar of the center heat sink 710 is visible. The stackable power semiconductor package system 700 is sealed by the injection of the molding compound 112.

Figure 9:
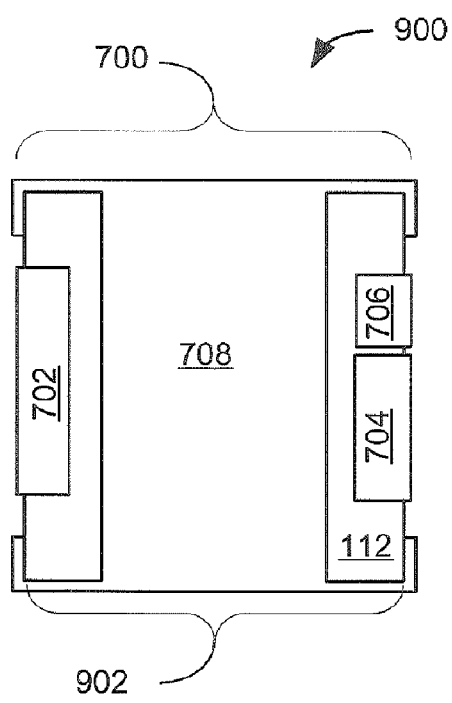
FIG. 9 is a top view of a stackable power semiconductor package system.

Referring now to FIG. 9, therein is shown a top view of a stackable power semiconductor package system 900. The top view shows a top 902 of the stackable power semiconductor package 900 and depicts the second upward bent source lead 702, the third upward bent source lead 704, the second upward bent gate lead 706, the second upper lead frame 708 and the molding compound 112. The position of contacts of the second upward bent source lead 702, the third upward bent source lead 704, the second upward bent gate lead 706 and the second upper lead frame 708 are separated by the molding compound 112 assuring good electrical and mechanical contact during stacked assembly.

Figure 10:
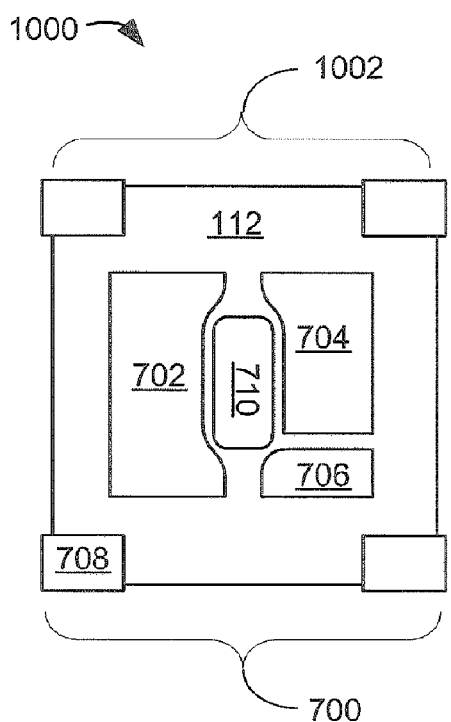
FIG. 10 is a bottom view of a stackable power semiconductor package system.

Referring now to FIG. 10, therein is shown a bottom view of a stackable power semiconductor package system 1000. The bottom view shows a bottom 1002 of the stackable power semiconductor package system 1000, the relative placement of the contact surfaces of the second upward bent source lead 702, the third upward bent source lead 704, the second upward bent gate lead 706, the second upper lead frame 708 and the center heat sink 710. The molding compound 112 is injected around the second upward bent source lead 702, the third upward bent source lead 704, the second upward bent gate lead 706, the second upper lead frame 708 and the center heat sink 710 insulating them and holding them in place. The large contact surface area provides efficient thermal transfer when the devices are stacked. The stackable power semiconductor package system 700 is intended to be stacked bottom to bottom. In order to facilitate the bottom-to-bottom connections, one of the packages is assembled in a mirror image configuration.

Figure 11:
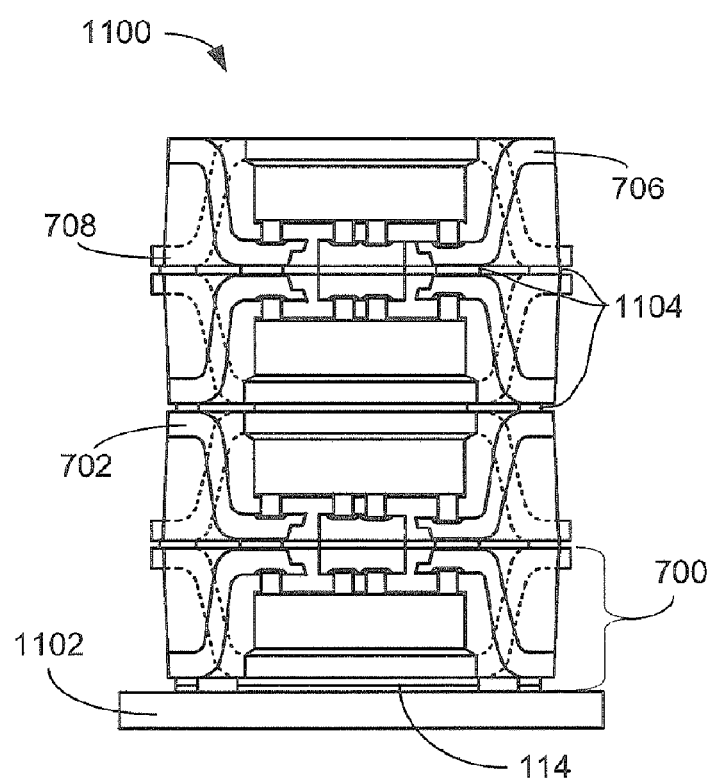
FIG. 11 is a four device stack of the stackable power semiconductor package system as shown in FIG. 7.

Referring now to FIG. 11, therein is shown a four device stack 1100 of the stackable power semiconductor package system 700 as shown in FIG. 7. The four device stack 1100 of the stackable power semiconductor package system 700 shows the configuration of four devices stacked with the bottom 1002 to the bottom 1002 on a PCB 1102 by a solder 1104. The configuration is for example only and is not limited to four stacked devices. There could be fewer or more devices in the stack as required.

The package stacking option enabled by the stackable power semiconductor package system 700 conserves space on the PCB 1102. The stackable power semiconductor package system 700 attaches to the PCB 1102 with the soft solder 114. The soft solder 114 also electrically and thermally connects the individual contacts of the second upward bent source lead 702, the third upward bent source lead 704, the second upward bent gate lead 706 and the second upper lead frame 708 in the stack. In this way, all of the contacts of the second upward bent source lead 702 are connected to each other and the PCB 1102. This is also true for the contacts of the second upward bent gate lead 706 and the contacts of the second upper lead frame 708.

Figure 12:
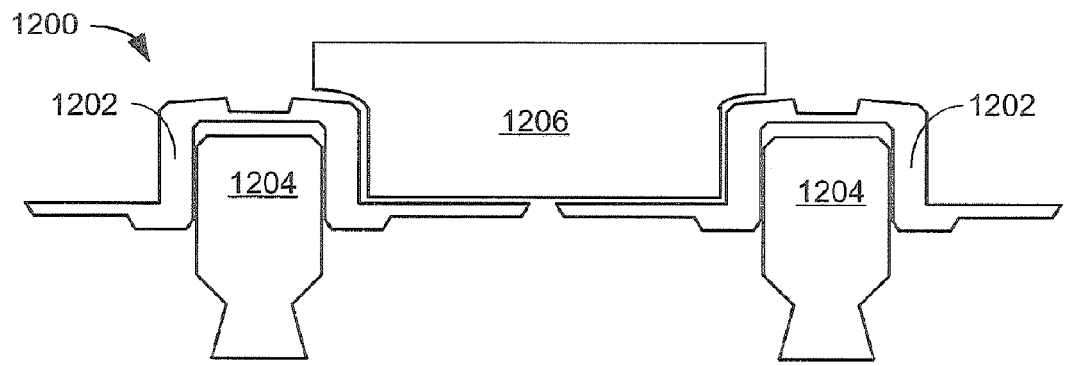
FIG. 12 is a punch tooling set for forming the upward bent lead frame segments of the present invention.

Referring now to FIG. 12, therein is shown a punch tooling set 1200 for forming the upward bent lead frame segments of the present invention. The punch tooling set 1200 is used for forming a thin sheet of an electrically conductive material 1202, such as copper or tin, into the desired shape and contour for lead frame manufacture. A first punch 1204 is used in conjunction with a die 1206 that allows the thin sheet of the electrically conductive material 1202 to form into a specific shape. The shape taken by the thin sheet of the electrically conductive material 1202 is an intermediate step in forming the "Z" bend for the upward bent segments of the lower lead frame 300 (not shown) of FIG. 3.

Figure 13:
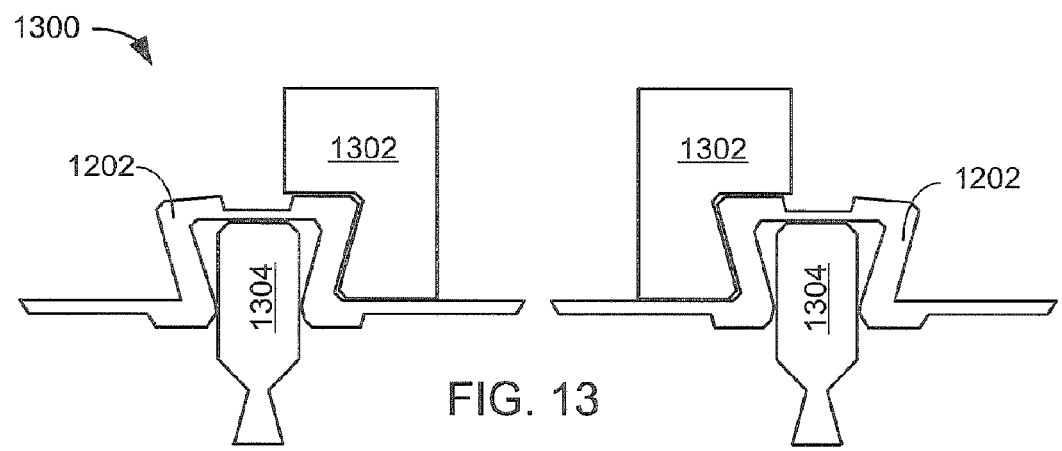
FIG. 13 is a wiping die tool set for forming the thin sheet of the electrically conductive material from FIG. 11.

Referring now to FIG. 13, therein is shown a wiping die tool set 1300 for forming the thin sheet of the electrically conductive material 1202 from FIG. 12. The wiping die tool set 1300 utilizes a wiping die 1302 to bend the thin sheet of the electrically conductive material 1202 punched by the tooling from FIG. 12. The wiping die 1302 provides a corner over which the thin sheet of the electrically conductive material 1202 is bent to form the bend of the upward bent lead frame segments of pieces of the lower lead frame 300 (not shown) of FIG. 3. A second punch 1304 acts as a stop to limit the degree of bending that the wiping die 1302 can deliver.

Figure 14:
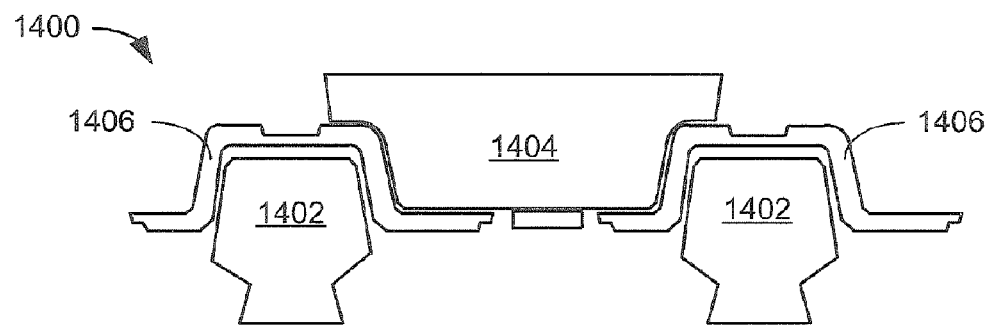
FIG. 14 is a second punch tool set for forming the lower lead frame pieces of FIG. 7.

Referring now to FIG. 14, therein is shown a second punch tool set 1400 for forming the lower lead frame pieces of FIG. 7. The second punch tool set 1400 includes a third punch 1402 and a shaping die 1404 for forming a second sheet of electrically conductive material 1406, such as copper or tin. The second sheet of electrically conductive material 1406 having been shaped by the second punch 1402 and the shaping die 1404 is then punched and sheared to form the lower lead frame 300 (not shown).

Figure 15:
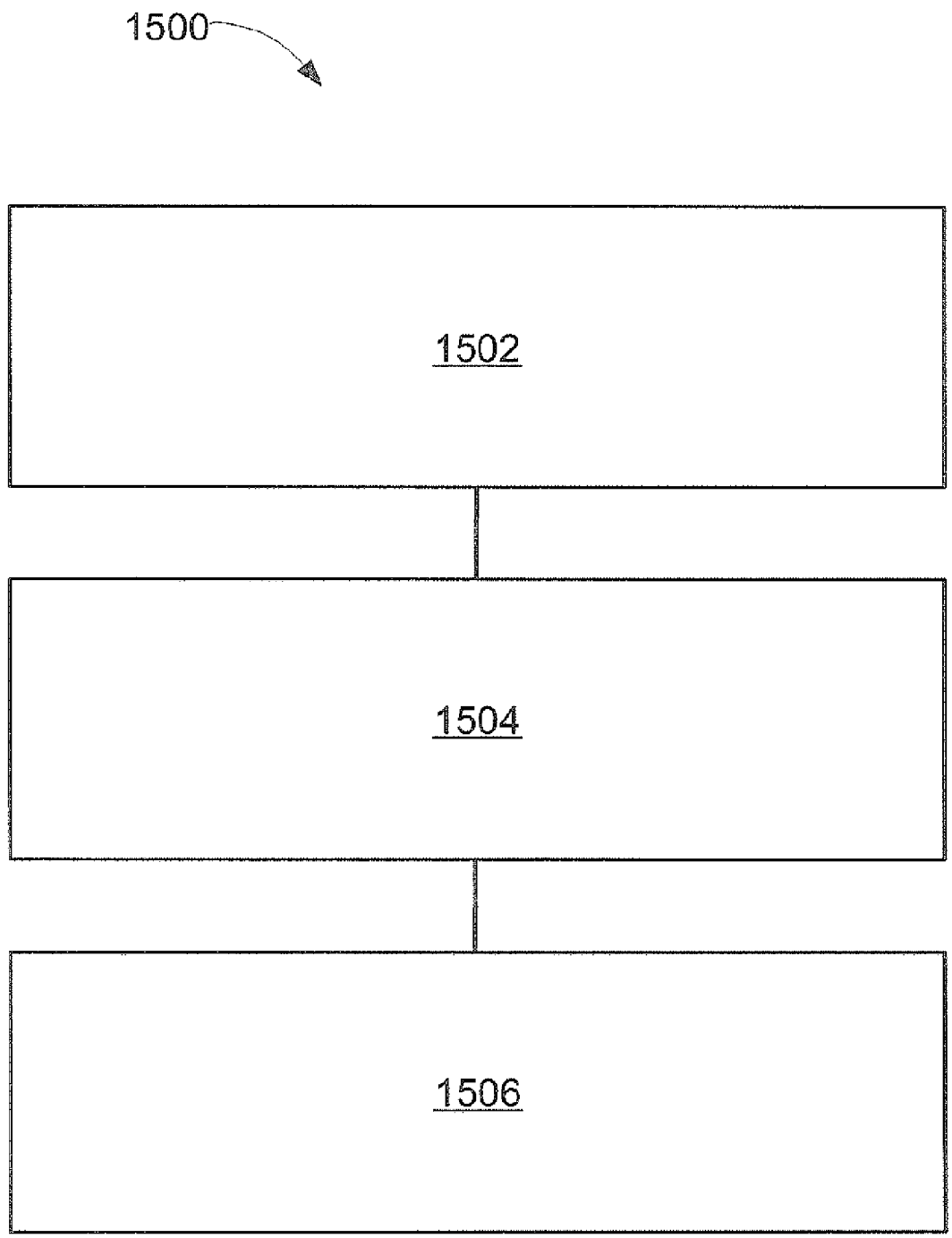
FIG. 15 is a flow chart of a method of making a stackable power semiconductor package, in an embodiment of the present invention.

Referring now to FIG. 15, therein is shown a flow chart of a method 1500 of making a stackable power semiconductor package, in an embodiment of the present invention. The method 1500 includes forming a lower lead frame, having an upward bent source lead and an upward bent gate lead in a block 1502; mounting a power semiconductor device on the lower lead frame utilizing interconnect structures in a block 1504; and forming an upper lead frame wherein the upper lead frame is on the power semiconductor device in a block 1506.

In greater detail, a method to system of stackable power semiconductor package, in an embodiment of the present invention, is performed as follows:

1. Forming a lower lead frame, having an upward bent source lead and an upward bent gate lead comprises providing electrical contacts on a top and a bottom of the stackable power semiconductor package system. (FIG. 1)
2. Mounting a power semiconductor device on the lower lead frame with interconnect structures. (FIG. 1)
3. Forming an upper lead frame comprises providing electrical contacts on the top and the bottom of the stackable power semiconductor package system. (FIG. 1)
4. Mounting the upper lead frame on the power semiconductor device further comprises attaching the upper lead frame with a solder. (FIG. 1) and
5. Injecting a molding compound around the power semiconductor device, the lower lead frame and the upper lead frame. (FIG. 1)

It has been discovered that the present invention thus has numerous aspects.

An aspect is that the present invention addresses the simplification of PCB layouts in the power section of the board. Another aspect is that stacked power semiconductor packages can efficiently dissipate power while minimizing the board space used. The stacked devices have direct thermal and electrical connection to the PCB, giving them an aspect that is unavailable to other packaged devices. The enhanced thermal characteristics of the stackable power semiconductor package system 100 and the stackable power semiconductor package system 700 allow heavy current usage with reduced junction temperatures.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the stackable power semiconductor package system of the present invention furnishes important and heretofore unknown and unavailable solutions, capabilities, and functional aspects for packaging power semiconductor devices. The resulting processes and configurations are straightforward, cost-effective, uncomplicated, highly versatile and effective, can be implemented by adapting known technologies, and are thus readily suited for efficiently and economically manufacturing of stackable power semiconductor package is fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hitherto fore set forth herein or shown in the accompanying drawings are to be interpreted in an illustrative and non-limiting sense.

What is claimed is:

1. A stackable power semiconductor package system comprising:
   a lower lead frame, having an upward bent source lead and an upward bent gate lead wherein the upward bent source lead and the upward bent gate lead are electrical contacts located on a top surface and a bottom surface of the stackable power package;
   a power semiconductor device mounted on the lower lead frame with interconnect structures comprises solder columns between a die metallization layer and a stress relief layer;
   an upper lead frame is attached with solder is on the power semiconductor device;
   the electrical contacts on the top of the stackable power semiconductor package are coplanar with the upper lead frame and the electrical contacts on the bottom of the stackable power semiconductor package are coplanar with the lower lead frame; and
   a molding compound is located around the power semiconductor device, the lower lead frame and the upper lead frame wherein the electrical contacts are exposed on the top surface and the bottom surface of the stackable power semiconductor package system by the molding compound that is coplanar with the lower lead frame and the upper lead frame.

2. The system as claimed in claim 1 further comprising a stack of the stackable power semiconductor package system, wherein the stackable power semiconductor package system has complementary interfaces and individual contacts provide electrical and thermal connection to the PCB for all stacked packages.

3. The system as claimed in claim 1 further comprising a clearance in the lower lead frame for the molding compound across the bottom of the stackable power semiconductor package system.

4. The system as claimed in claim 1 wherein the molding compound is solder resist regions located around the lower lead frame and the upper lead frame.

* * * * *